(12) United States Patent
Ho et al.

(10) Patent No.: US 7,372,679 B1
(45) Date of Patent: May 13, 2008

(54) METHOD AND APPARATUS FOR RC TRIGGERED ELECTROSTATIC DISCHARGE POWER CLAMP WITH HYSTERESIS

(75) Inventors: Fu-Hing Ho, San Francisco, CA (US); Patrick J. Crotty, San Jose, CA (US); Andy T. Nguyen, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 362 days.

(21) Appl. No.: 10/871,070

(22) Filed: Jun. 18, 2004

(51) Int. Cl.
*H02H 3/22* (2006.01)
(52) U.S. Cl. .......................................... 361/56; 361/111
(58) Field of Classification Search ............ 361/56–28, 361/56–58, 91.1, 111, 87
See application file for complete search history.

(56) References Cited

U.S. PATENT DOCUMENTS

| | | | |
|---|---|---|---|
| 5,311,391 A * | 5/1994 | Dungan et al. ............... 361/56 |
| 5,463,520 A | 10/1995 | Nelson | |
| 5,978,192 A * | 11/1999 | Young et al. .................. 361/56 |
| 6,069,782 A * | 5/2000 | Lien et al. .................... 361/111 |
| 6,552,886 B1 | 4/2003 | Wu et al. | |
| 6,690,561 B2 * | 2/2004 | Hung et al. .................. 361/111 |
| 6,919,602 B2 * | 7/2005 | Lin et al. ..................... 257/360 |
| 6,965,503 B2 * | 11/2005 | Connor et al. ................. 361/56 |
| 2004/0109270 A1 * | 6/2004 | Stockinger et al. ........... 361/56 |
| 2004/0109271 A1 * | 6/2004 | Takeda ......................... 361/56 |

* cited by examiner

*Primary Examiner*—Michael Sherry
*Assistant Examiner*—Danny Nguyen
(74) *Attorney, Agent, or Firm*—LeRoy D. Maunu; Lois D. Cartier

(57) ABSTRACT

An Electrostatic Discharge (ESD) protection device extends the protection range of an ESD clamp circuit through hysteresis of the associated ESD clamp control circuit. Once the ESD clamp circuit is activated, an adjustment circuit applies a trigger level adjustment signal to the ESD clamp control circuit. The trigger level adjustment signal effectively increases the magnitude of the deactivation signal that is required to deactivate the ESD clamp circuit. Since the deactivation signal increases over time, a longer activation time of the ESD protection device is provided, which allows an extended protection range.

18 Claims, 3 Drawing Sheets

METHOD AND APPARATUS FOR RC TRIGGERED ELECTROSTATIC DISCHARGE POWER CLAMP WITH HYSTERESIS

FIELD OF THE INVENTION

The present invention generally relates to Electrostatic Discharge (ESD) protection circuits, and more particularly to ESD protection circuits exhibiting extended protection characteristics.

BACKGROUND OF THE INVENTION

Electrostatic discharge (ESD) is a common occurrence in everyday life. While walking along a carpeted floor in a dry, heated room, for example, enough static electricity is stored within the human body to provide quite a shocking experience when contact is make with another object. Such a contact allows the stored static electricity to suddenly discharge from the human body into the contacted object. While this sudden discharge of static electricity may be of no harm to human bodies, it can be very damaging to electronic devices which are sensitive to ESD.

When an electrostatically charged person or object touches, or comes within sufficient proximity to, an ESD sensitive device, there is a possibility that the electrostatic charge can be discharged through circuitry contained within the ESD sensitive device. Such an ESD event could cause damage to occur in the electronic device due to, for example, localized overheating. Localized overheating may particularly occur at the interfaces associated with the electronic device, since the interfaces are first to come into contact with the electrostatic discharge. Of particular interest, are those electronic devices that are implemented on an Integrated Circuit (IC).

The current trend in IC design is to reduce component dimensions to improve performance characteristics such as parasitic delay, operational speed, and cost. Those same dimension reductions, however, may also contribute to ESD sensitivity. In particular, reduced device dimensions including shortened channel lengths, thinner gate oxide layers, and shallower junction depths may contribute to increased ESD sensitivity of the IC.

Depending on the type of IC interface and mode of operation, several conventional approaches have been devised to help mitigate the effects of ESD events. The simplest approach perhaps, is a resistor/capacitor (RC) combination placed at every driver output and receiver input on the IC, where a series connected resistor limits peak current caused by the ESD event, and a shunt capacitor limits short-term voltage peaks caused by the ESD event. Although the RC combination is relatively inexpensive, it only limits voltage slew rate, not peak voltage, and produces low pass filter (LPF) distortion, which among other detriments, reduces the maximum data rate possible.

Another conventional approach taken to mitigate ESD event damage utilizes an RC control circuit to activate a shunt device during an ESD event so that current resulting from the ESD event may be "shunted" away from the protected circuit. The inability, however, of the control circuit to: adequately detect the presence of an ESD event; while also allowing sufficient time to "shunt" current away from the protected circuit during the ESD event, have created a need for an improvement in conventional ESD protection circuitry.

In particular, although increasing the time constant of the RC control circuit results in a longer amount of time that may be used to "shunt" current away from the protected circuit, it also results in an increase in the physical dimensions of the components used to implement the RC control circuit. The physical size of these components, however, precludes their use in IC applications because of the significant amount of die area required to realize such components. Thus, other design approaches should be considered that not only provide extended ESD event protection, but also conform to the current trend in IC design to decrease component dimensions.

An apparatus and method that addresses the aforementioned problems, as well as other related problems, are therefore desirable.

SUMMARY OF THE INVENTION

To overcome limitations in the prior art, and to overcome other limitations that will become apparent upon reading and understanding the present specification, the present invention discloses a method and apparatus that establishes hysteresis within an ESD clamp circuit. The hysteresis is effective to extend the ESD clamp circuit's effectiveness during an ESD event, while conforming the physical dimensions of the ESD clamp control circuit to current IC design constraints.

In accordance with one embodiment of the invention, an Electrostatic Discharge (ESD) clamp circuit comprises a damping circuit coupled to receive an ESD signal and is adapted to deliver a damped signal in response to the ESD signal. The ESD clamp circuit further comprises a control circuit coupled to receive the ESD and damped signals and is adapted to provide a control signal when a magnitude of the ESD signal exceeds a magnitude of the damped signal. The ESD clamp circuit further comprises an ESD clamp circuit coupled to receive the control signal and is adapted to activate a conductive path for the ESD signal in response to the control signal.

In accordance with another embodiment according to the invention, an Electrostatic Discharge (ESD) protection circuit comprises a means for receiving an ESD signal, a means for generating a damped signal in response to the ESD signal, a means for activating a conduction circuit when a magnitude of the ESD signal exceeds a magnitude of the damped signal, and a means for conducting the ESD signal through the conduction circuit. The conduction circuit, includes an ESD clamp circuit in one aspect of the present invention.

In accordance with another embodiment according to the invention, a method of operating an Electrostatic Discharge (ESD) protection circuit comprises receiving an ESD signal, generating a damped signal in response to the ESD signal, activating a conduction circuit, for example a clamp circuit, when a magnitude of the ESD signal exceeds a magnitude of the damped signal, and conducting the ESD signal through the conduction circuit.

In accordance with another embodiment according to the invention, an Electrostatic Discharge (ESD) control circuit comprises an RC circuit coupled to receive a power supply signal and is adapted to generate a damped signal at a first node in response to the power supply signal. The ESD control circuit further comprises an inverting stage coupled to the first node and is adapted to assert a control signal indicative of an over-voltage condition. The inverting stage comprises a first transistor coupled to receive the power supply signal and the damped signal and is adapted to conduct the power supply signal when the power supply signal exceeds the damped signal.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION OF THE DRAWINGS

Figure 1:
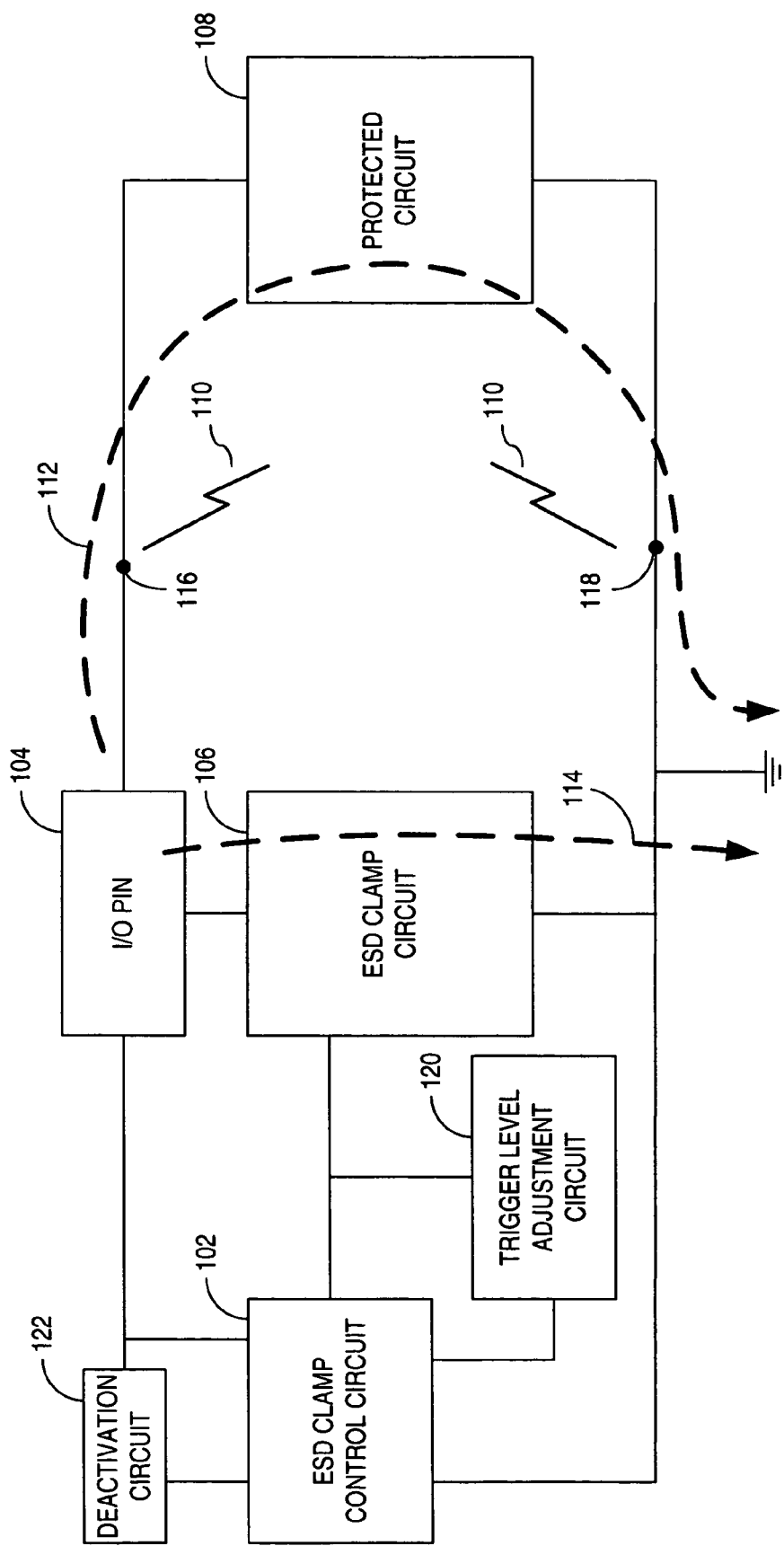
FIG. 1 illustrates an exemplary Electrostatic Discharge (ESD) event scenario.

Various embodiments of the present invention are described in terms of an ESD clamp circuit and associated hysteretic control circuitry. The hysteretic control circuitry of the present invention exhibits a higher rising edge trigger and a lower falling edge trigger to extend the active range of the ESD clamp circuit past the range exhibited by conventional ESD clamp control circuits. Embodiments of an ESD clamp circuit according to the present invention are shown using complimentary P-type Field Effect Transistor (PFET) and N-type (NFET) topologies. Those skilled in the art will appreciate that the invention could be implemented in other circuit topologies, such as bipolar or bi-Complimentary Metal Oxide Semiconductor (biCMOS), circuit topologies.

Generally speaking, electrostatic charge associated with an object is stored within a capacitance associated with that object and may accumulate to an extremely high potential. The human body, for example, has an associated capacitance that is capable of storing up to 25 Kilovolts (KV) of electrostatic charge. When two objects having unequal amounts of stored electrostatic charge are brought within contact or proximity to each other, an ESD event may occur causing damage to one or both of the objects.

Basically, two categories of damage from such an ESD event may occur. First, catastrophic damage may occur, in which the object is rendered inoperable immediately after the ESD event. In the event that the catastrophically damaged object is an IC, a semiconductor junction or a connecting metallization within the IC, for example, may have been permanently damaged by the ESD event.

On the other hand, latent damage may occur, whereby the object appears to be normally operable immediately after the ESD event, but may fail to operate properly at some point in the future. The latent damage does not necessarily render the damaged device totally inoperable, but may instead result in diminished performance.

One example of latent damage effects caused by an ESD event is the unintended coupling of a received signal onto a subsequently transmitted signal. Such may be the case for example with an RS-232 serial device, whereby after an ESD event, inadmissible current paths exist within the RS-232 device, such that unintended coupling of received data energy onto transmitted data energy causes crosstalk or data errors. Still other examples of latent ESD event damage may allow received RS-232 current to feed through to the power supply. In such an instance, if the power supply is unable to maintain its nominal output voltage by sinking this excess current, noise may be coupled onto other devices that derive their operational power from the power supply. Under extreme conditions, these devices may even be damaged by the over-voltage produced by the power supply.

An ESD sensitive device may be virtually any device susceptible to damage caused by an over-voltage condition. Most often, ESD event damage causes field and/or production failures at the interface connectors of, for example, desktop computers, notebooks, modems, and other communication devices. ESD event damage may also occur in lower level electronic assemblies such as populated Printed Circuit Boards (PCBs), ICs, or even discrete components such as transistors and diodes.

A diagram of an example ESD event scenario is depicted in FIG. 1. Protected circuit 108 may represent an ESD sensitive device being subjected to ESD event 110, which may represent a discharge of stored electrostatic charge from, for example, a technician performing assembly testing on protected circuit 108. ESD event 110 may be capable of creating a voltage differential between I/O pin 104 and system ground of many thousands of volts. In response to the sudden increase in potential, ESD surge current may flow in paths represented by path 112 and path 114.

In one embodiment of the present invention, ESD clamp circuit 106, ESD clamp control circuit 102, trigger adjustment circuit 120, and deactivation circuit 122 operate at least to: minimize the amount of current flowing in path 112; and to maximize the amount of current flowing in path 114, during ESD event 110. In addition, ESD clamp circuit 106 is rendered inoperative under normal operating conditions by deactivation circuit 122, i.e., in the absence of ESD event 110, such that protected circuit 108 may derive operational signals via path 112 for normal operation.

ESD clamp control circuit 102 asserts a logic signal to the input of ESD clamp circuit 106 during an ESD event, such that ESD clamp circuit 106 activates during the ESD event to maximize the amount of current flowing via path 114. Thus, during the activation time of ESD clamp circuit 106, the amount of potentially destructive current flowing via path 112 is minimized. After an amount of time has elapsed, ESD clamp control circuit 102 receives a deactivation signal from deactivation circuit 122. The output of ESD clamp control circuit 102 then deactivates ESD clamp circuit 106 in response to the deactivation signal, but the deactivation is delayed due to the elevated trigger level provided by trigger level adjustment circuit 120.

One advantage associated with an embodiment of the present invention, is that the duration of the activation time of ESD clamp circuit 106 is substantially lengthened to provide additional protection to protected circuit 108. In particular, trigger level adjustment circuit 120 is activated during ESD event 110 to raise the trigger level of ESD clamp control circuit 102, such that the deactivation of ESD clamp circuit 106 is retarded. In so doing, a substantially lengthening of the activation time of ESD clamp circuit 106 allows extended protection over conventional ESD protection circuits as further illustrated by FIG. 2.

Figure 2:
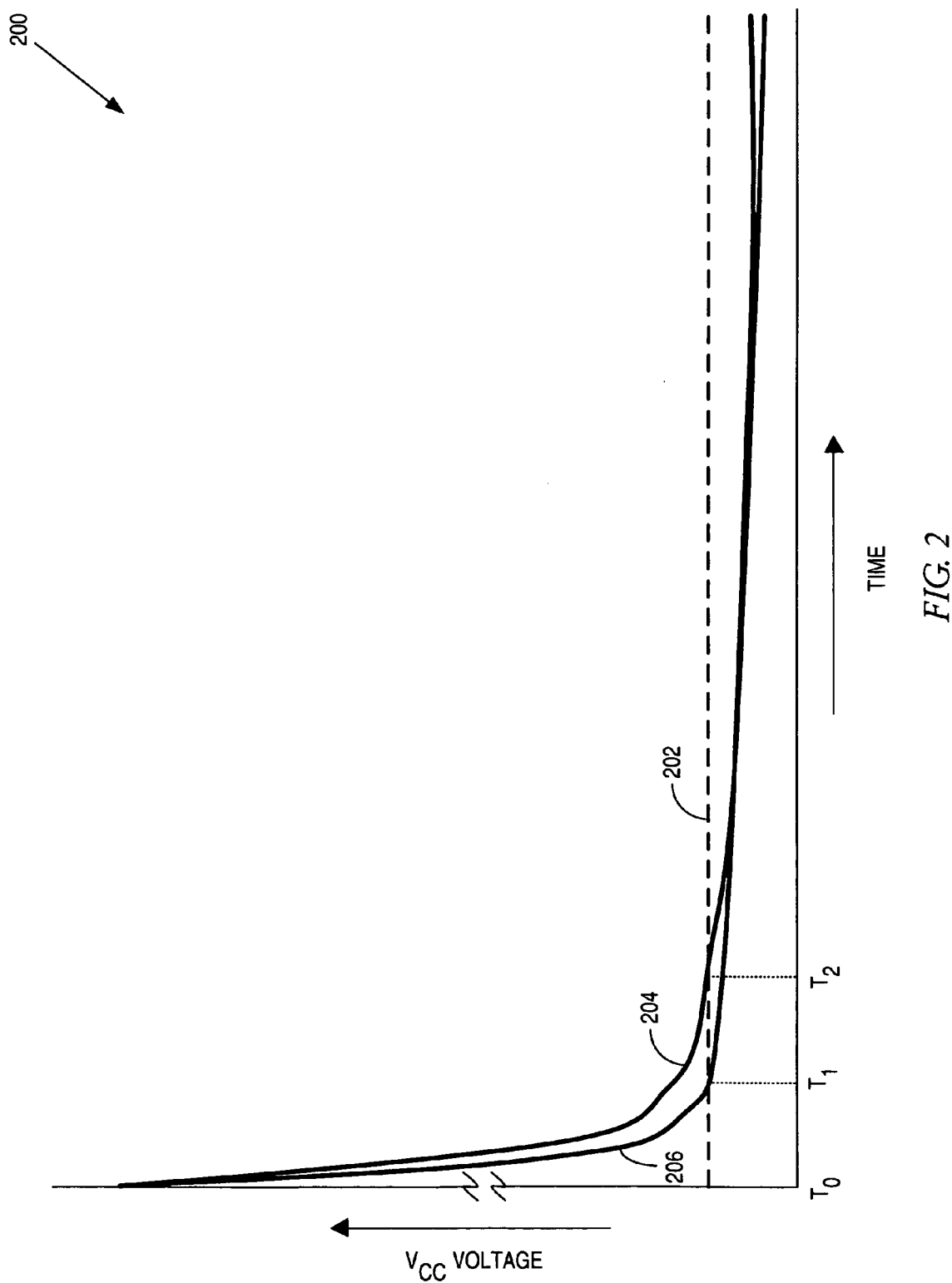
FIG. 2 illustrates exemplary voltage waveforms resulting from the ESD event scenario of FIG. 1.

FIG. 2 illustrates voltage waveforms 200 that may appear across nodes 116 and 118 during ESD event 110. Voltage waveform 204 illustrates an exemplary voltage magnitude over time that may appear across nodes 116 and 118 using a conventional ESD protection circuit. In contrast, voltage waveform 206 illustrates an exemplary voltage magnitude over time that may appear across nodes 116 and 118 using an ESD protection circuit in accordance with the present invention. Dashed line 202 represents, for example, a "safe" voltage magnitude, whereby any voltage appearing across nodes 116 and 118 whose magnitude is lower than line 202 results in no damage to protected circuit 108. Conversely, any voltage appearing across nodes 116 and 118 whose magnitude is greater than line 202 for an extended amount of time, may potentially inflict latent or even catastrophic damage to protected circuit 108.

At time $T_0$, a surge voltage of several thousands of volts results from ESD event 110 and appears across nodes 116 and 118. Using a conventional ESD protection device, a voltage magnitude exceeding dashed line 202 appears across nodes 116 and 118 until time $T_2$. After time $T_2$, the conventional ESD protection device has diverted enough current away from protected circuit 108 such that the voltage across nodes 116 and 118 is below "safe" voltage 202. By the time $T_2$ has transpired, however, the conventional ESD protection device may have allowed sufficient persistence of the excess voltage condition so as to cause damage to protected circuit 108.

On the other hand, if an ESD protection device in accordance with the present invention is employed, excess voltage 206 is reduced to "safe" voltage level 202 at time $T_1$. Thus, since time $T_1$ occurs prior to time $T_2$, the ESD protection device in accordance with an embodiment of the present invention alleviates the over voltage condition sooner, as compared to the conventional ESD protection device, thus providing a greater degree of protection to protected circuit 108.

Figure 3:
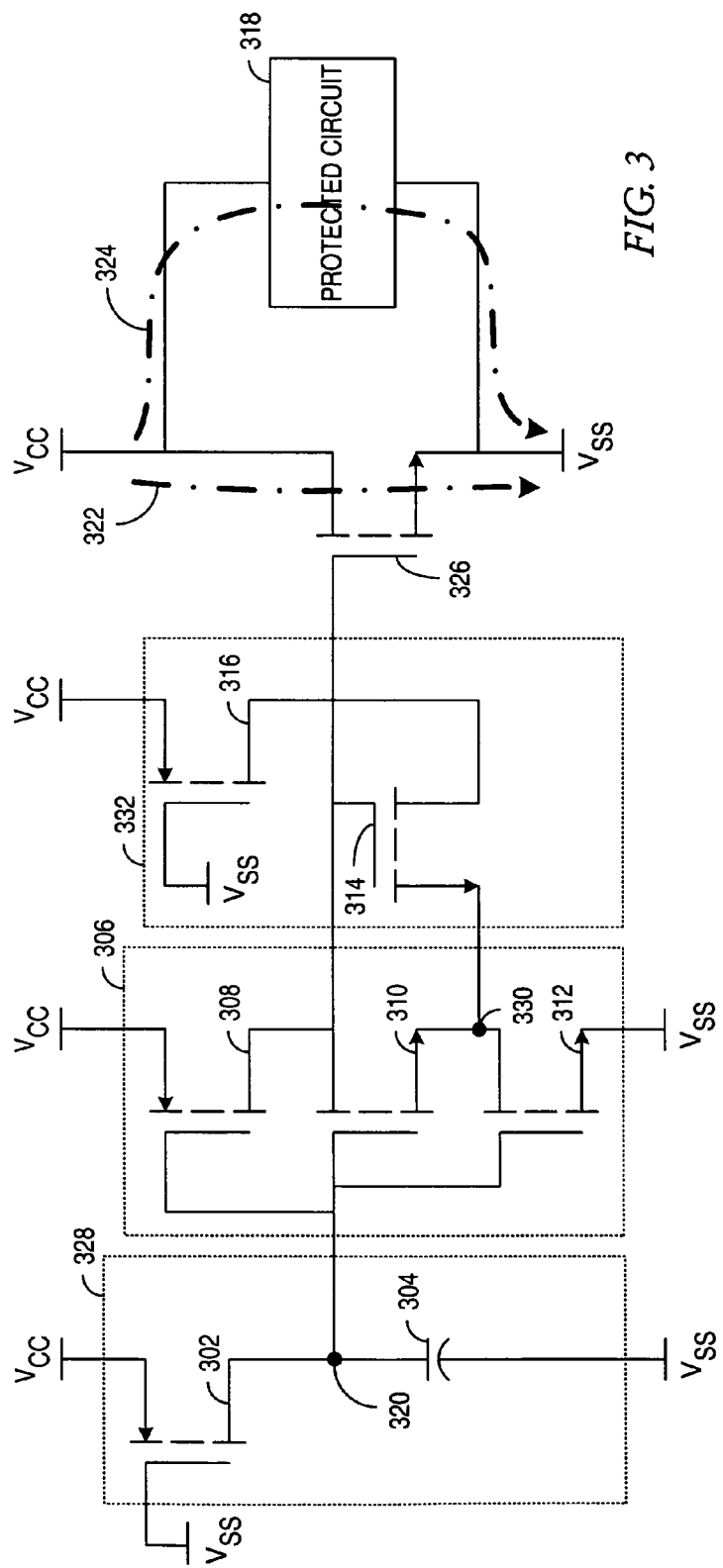
FIG. 3 illustrates an exemplary embodiment of an ESD clamp control circuit in accordance with the present invention.

FIG. 3 illustrates a detailed view of an ESD protection device in accordance with an exemplary embodiment of the present invention, where protected circuit 318 may represent the ESD sensitive device being protected and transistor 326 may represent ESD clamp circuit 106 of FIG. 1. Block 306 may represent an exemplary implementation of ESD clamp control circuit 102, block 328 may represent an exemplary implementation of deactivation circuit 122, while block 332 may represent an exemplary implementation of trigger level adjustment circuit 120 in accordance with the present invention.

With respect to block 328, the source of P-type transistor 302 is connected to a top rail power supply, e.g., $V_{CC}$, whereas the gate of transistor 302 is connected to bottom rail power supply, e.g., $V_{SS}$. Thus, once $V_{CC}$ exceeds $V_{SS}$ by the threshold voltage of transistor 302, transistor 302 is placed into a conductive state, which exhibits a resistance magnitude of $R_{DS-ON}$, where $R_{DS-ON}$ is the drain to source resistance of transistor 302 in its conductive state. Capacitor 304 combines in series with transistor 302 to create deactivation circuit 328 that exponentially responds at node 320 to voltage excitations presented across terminals $V_{CC}$ and $V_{SS}$. It should be noted that the resistive element illustrated by gate grounded PFET 302 may be implemented in any number of resistive configurations including: salicide blocked poly, gate to $V_{CC}$ shorted NFET, salicide blocked diffusion, deposited high ohmic material, etc.

With respect to block 306, P-type transistor 308 is connected in series with N-type transistor 310, whereby their respective drain and gate terminals are commonly connected. Transistor 312 is connected in series with transistor 310, whereby their respective gate terminals are connected together and the source terminal of transistor 310 is connected to the drain terminal of transistor 312. The source terminal of transistor 308 is connected to $V_{CC}$ and the source terminal of transistor 312 is connected to $V_{SS}$. Block 306 may also be recognized by those skilled in the art as an inverter having an additional N-type transistor connected at the pull down stage.

With respect to block 332, the gate terminal of N-type transistor 314 is connected to the commonly connected drain terminals of transistors 308 and 310. The source terminal of transistor 314 is connected to the commonly connected source and drain terminals of transistors 310 and 312, respectively, at node 330. The drain terminal of transistor 314 is connected to the drain terminal of P-type transistor 316, whereby transistor 316 is implemented as a resistive element as similarly discussed in relation to transistor 302.

In operation, deactivation circuit 328, ESD clamp control circuit 306, trigger level adjustment circuit 332, and ESD clamp circuit 326 operate to provide a current path denoted by line 322 during an over-voltage condition caused by, for example, an ESD event. In particular, the exemplary connections that are considered to be subject to the over-voltage condition are terminals $V_{CC}$ and $V_{SS}$.

In such an instance, the output of inverter 306 operates to render transistor 326 conductive, by asserting a logic high at the gate terminal of transistor 326, so as to provide current path 322 during the over-voltage condition. Furthermore, the conductive state of transistor 326 is extended for a longer period of time during the ESD event through operation of trigger level adjustment circuit 332. That is to say, that the signal level at node 320 that is required from deactivation circuit 328 to trigger the output of inverter 306 to a logic low is increased. Thus, a longer amount of time is needed to render transistor 326 non-conductive, which results in extended persistence of current path 322.

In the absence of ESD event 110, deactivation circuit 328 renders transistor 326 non-conductive throughout the power on cycle. Thus, current path 324 is activated to provide protected circuit 318 with operational current under normal operating conditions. The voltage diagrams of FIGS. 2 and 4 will now be described in relation to FIG. 3 to illustrate over-voltage and normal operation, respectively.

With respect to FIG. 2, an ESD event occurs at time $T_0$, which begins an over-voltage condition such that the voltage appearing across terminals $V_{CC}$ and $V_{SS}$ exceeds, for example, the "safe" voltage level denoted by dashed line 202. In addition, the ESD event causes the voltage generated across terminals $V_{CC}$ and $V_{SS}$ to rise much faster than the voltage at node 320, due to the RC time constant generated by deactivation circuit 328.

Transistor 308 is rendered conductive at some time after $T_0$, once the voltage at terminal $V_{CC}$ exceeds the voltage at node 320 by an amount greater than the threshold voltage of transistor 308. A voltage is then generated at the gate terminal of transistor 326 that is substantially equal to the potential appearing at terminal $V_{CC}$, minus the drain to source voltage, $V_{DS}$, of transistor 308. Thus, transistor 308 effectively "pulls-up" the gate potential of transistor 326 to render it conductive, such that current path 322 is allowed to exist, thus forcing the voltage appearing across terminal $V_{CC}$ and $V_{SS}$ to be substantially equal to $V_{DS}$ of transistor 326.

Trigger level adjustment circuit 332 is also activated by the conductive state of transistor 308. In particular, the gate to source voltage, $V_{GS}$, of transistor 314 renders transistor 314 conductive. Transistor 316 functions as a resistive component, such that the source terminal of transistor 310 at node 330 is pulled up to a higher potential. In so doing, the threshold voltage of transistor 310 increases due to the substrate bias effect, i.e., body effect.

Furthermore, by raising the source potential of transistor 310, the amount of gate potential that is required to render transistor 310 conductive also increases. Accordingly, the exponential voltage at node 320 produced by deactivation circuit 328 requires an extended amount of time in accordance with the RC time constant to obtain the required deactivation voltage.

Thus, through operation of trigger level adjustment circuit 332, transistor 310 requires a higher potential from deactivation circuit 328 at node 320 to be rendered conductive. Once conductive, transistors 310 and 312 "pull-down" the gate terminal of transistor 326 to a logic low level, which renders transistor 326 non-conductive to end the ESD event protection sequence.

Figure 4:
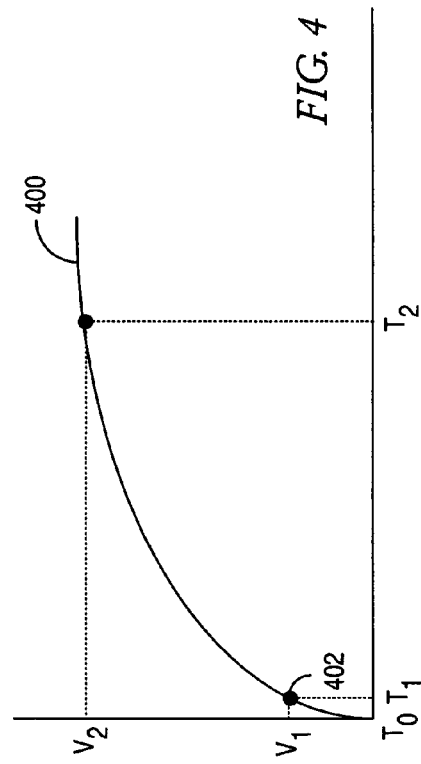
FIG. 4 illustrates an exemplary voltage waveform under normal operating conditions.

With respect to FIG. 4, a normal operation is depicted, whereby operational voltage is applied across terminals $V_{CC}$ and $V_{SS}$ at time $T_0$ causing exponential voltage 400 to appear at node 320. The time constant of deactivation circuit 328 is set such that voltages $V_1$ and $V_2$ appear at node 320 at times $T_1$ and $T_2$, respectively. In addition, the operational voltage across terminals $V_{CC}$ and $V_{SS}$ rises slower than the RC time constant generated by trigger circuit 328.

At time $T_1$, although voltage 402 generated at node 320 has exceeded the threshold voltages of transistors 312 and 310 to render them conductive, the gate to source voltage of transistor 308 is insufficient to render transistor 308 conductive. As such, the gate to source voltages of transistors 314 and 326 are insufficient to render them conductive, thereby disabling current path 322.

At time $T_2$, an operational voltage is achieved such that the voltage at node 320 is substantially equal to the operational voltage at terminal $V_{CC}$. Transistor 308, however, remains non-conductive while transistors 310 and 312 persist in their conductive state. Thus, the gate to source voltage of transistor 326 is insufficient to render transistor 326 conductive and current path 322 remains disabled, while current path 324 is allowed to provide operational current to protected circuit 318. It can be seen, therefore, that under normal operating conditions, ESD clamp circuit 326 is disabled by inverter 306 throughout the power-up sequence.

The present invention is believed to be applicable in a variety of ESD protection applications. In particular, although the ESD protection circuits disclosed herein have been discussed in relation to IC applications, one of ordinary skill in the art will recognize relevant application in discrete applications as well. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. An Electrostatic Discharge (ESD) protection circuit, comprising:
   a control circuit coupled to receive an ESD signal and a deactivation signal and adapted to assert a control signal in response to a magnitude of the ESD signal exceeding a magnitude of the deactivation signal and further adapted to deassert the control signal in response to the deactivation signal exceeding a threshold level;
   an adjustment circuit coupled to receive the control signal and adapted to increase the threshold level in response to the asserted control signal;
   a clamp circuit adapted to conduct the ESD signal in response to the asserted control signal,
   wherein the control circuit includes an inverter, the inverter comprising a pull-up transistor coupled to receive the deactivation signal at a control terminal and coupled to receive the ESD signal at a first conduction terminal and adapted to be conductive in response to the magnitude of the ESD signal exceeding the magnitude of the deactivation signal; and
   a pull-down transistor pair coupled to receive the deactivation signal at a common control terminal, wherein the pull-down transistor pair is rendered conductive in response to the magnitude of the deactivation signal exceeding the threshold level.

2. The ESD protection circuit according to claim 1, further comprising a deactivation circuit coupled to receive the ESD signal and adapted to provide the deactivation signal in response to receiving the ESD signal.

3. The ESD protection circuit according to claim 2, wherein the deactivation circuit comprises:
   a resistive element coupled to receive the ESD signal; and
   a capacitive element coupled to the resistive element at a common node, wherein the deactivation signal is generated at the common node.

4. The ESD protection circuit of claim 1, wherein the pull-down transistor pair is coupled to receive a trigger level adjustment signal at a threshold control node.

5. The ESD protection circuit of claim 4, wherein the trigger level adjustment signal increases the threshold level by increasing the threshold voltage of a first transistor of the pull-down transistor pair.

6. The ESD protection circuit according to claim 4, wherein the adjustment circuit comprises:
   a first transistor coupled to receive the control signal at a control terminal and having a first conduction terminal coupled to the threshold control node; and
   a second transistor having a first conduction terminal coupled to a second conduction terminal of the first transistor, wherein the conductivity state of the first and second transistors increases a voltage level at the threshold control node.

7. An Electrostatic Discharge (ESD) protection circuit, comprising:
   means for generating a deactivation signal in response to receiving an ESD signal;
   means for activating a conduction circuit in response to a magnitude of the ESD signal exceeding a magnitude of the deactivation signal;
   means for deactivating the conduction circuit in response to the magnitude of the deactivation signal exceeding an adjustable threshold;
   means for increasing the adjustable threshold in response to the conduction circuit being activated,
   wherein the means for deactivating comprises an inverter, the inverter comprising:
   a pull-up transistor coupled to receive the deactivation signal at a control terminal and coupled to receive the ESD signal at a first conduction terminal and adapted to be conductive in response to the magnitude of the ESD signal exceeding the magnitude of the deactivation signal; and
   a pull-down transistor pair coupled to receive the deactivation signal at a common control terminal, wherein the pull-down transistor pair is rendered conductive in response to the magnitude of the deactivation signal exceeding the adjustable threshold.

8. A method of operating an excess voltage protection circuit, comprising:
   generating a deactivation signal in response to receiving an excess voltage signal;
   activating a conduction circuit to conduct the excess voltage signal in response to the excess voltage signal exceeding the deactivation signal;

increasing a deactivation threshold of the conduction circuit while the conduction circuit is activated;

deactivating the conduction circuit in response to the deactivation signal exceeding the deactivation threshold, wherein the deactivating of the conduction circuit utilizes an inverter, the inverter comprising a pull-up transistor coupled to receive the deactivation signal at a control terminal and coupled to receive the excess voltage signal at a first conduction terminal and adapted to be conductive in response to the magnitude of the excess voltage signal exceeding the magnitude of the deactivation signal; and a pull-down transistor pair coupled to receive the deactivation signal at a common control terminal, wherein the pull-down transistor pair is rendered conductive in response to the magnitude of the deactivation signal exceeding the deactivation threshold.

9. The method according to claim 8, wherein generating the deactivation signal comprises forming an exponentially increasing voltage.

10. The method according to claim 9, wherein the conduction circuit comprises a clamp circuit.

11. The method according to claim 8, wherein increasing the deactivation threshold comprises increasing a threshold voltage of a pull-down transistor within an activation circuit.

12. The method according to claim 11, wherein deactivating the conduction circuit comprises generating a voltage at a control terminal of the pull-down transistor that exceeds the threshold voltage of the pull-down transistor.

13. In an Integrated Circuit (IC), an Input/Output (I/O) pin protection circuit comprising:

a control circuit coupled to an I/O pin of the IC and coupled to receive a deactivation signal and adapted to assert a control signal in response to a magnitude of an I/O signal received at the I/O pin exceeding a magnitude of the deactivation signal and further adapted to deassert the control signal in response to the magnitude of the deactivation signal exceeding a threshold level;

an adjustment circuit coupled to receive the control signal and adapted to increase the threshold level in response to the asserted control signal;

a clamp circuit adapted to conduct the I/O signal in response to the asserted control signal, wherein the control circuit includes an inverter, the inverter comprising:

a pull-up transistor coupled to receive the deactivation signal at a control terminal and coupled to receive the ESD signal at a first conduction terminal and adapted to be conductive in response to the magnitude of the ESD signal exceeding the magnitude of the deactivation signal; and a pull-down transistor pair coupled to receive the deactivation signal at a common control terminal, wherein the pull-down transistor pair is rendered conductive in response to the magnitude of the deactivation signal exceeding the threshold level.

14. The I/O pin protection circuit according to claim 13, further comprising a deactivation circuit coupled to receive the I/O signal and adapted to provide the deactivation signal in response to receiving the I/O signal.

15. The I/O pin protection circuit according to claim 14, wherein the deactivation circuit comprises:

a resistive element coupled to receive the I/O signal; and a capacitive element coupled to the resistive element at a common node, wherein the deactivation signal is generated at the common node.

16. The I/O pin protection circuit of claim 13, wherein the pull-down transistor pair is coupled to the adjustment circuit to receive a trigger level adjustment signal at a threshold control node.

17. The I/O pin protection circuit of claim 16, wherein the trigger level adjustment signal increases the threshold level by increasing a threshold voltage of a first transistor of the pull-down transistor pair.

18. The I/O pin protection circuit according to claim 16, wherein the adjustment circuit comprises:

a first transistor coupled to receive the control signal at a control terminal and having a first conduction terminal coupled to the threshold control node; and a second transistor having a first conduction terminal coupled to a second conduction terminal of the first transistor, wherein the conductivity state of the first and second transistors increases a voltage level at the threshold control node.

* * * * *